United States Patent [19]
Dumoulin et al.

[11] Patent Number: 5,375,598
[45] Date of Patent: Dec. 27, 1994

[54] METHODS FOR THE IMAGING OF SHEAR RATE IN MOVING FLUIDS

[75] Inventors: Charles L. Dumoulin, Ballston Lake; Lorinda R. Opsahl, Latham, both of N.Y.

[73] Assignee: General Electric Company, Schenectady, N.Y.

[21] Appl. No.: 173,022

[22] Filed: Dec. 27, 1993

[51] Int. Cl.$^5$ ............................................. A61B 5/055
[52] U.S. Cl. ................................. 128/653.3; 324/306; 324/309
[58] Field of Search .......................... 128/653.2, 653.3; 324/306, 307, 309

[56] References Cited

U.S. PATENT DOCUMENTS

| | | | |
|---|---|---|---|
| 4,714,081 | 12/1987 | Dumoulin et al. | 128/653 |
| 5,022,397 | 6/1991 | Dumoulin | 128/653.3 |
| 5,233,298 | 8/1993 | Dumoulin | 128/653.3 |

OTHER PUBLICATIONS

"Simultaneous Acquisition of Phase Contrast Angiograms and Stationary Tissue Images with Hadamard Encoding of flow Induced Phase Shifts", Dumoulin et al., Journal of Magnetic Resonance Imaging, vol. 1, pp. 399–404, 1991.

Primary Examiner—Ruth S. Smith
Attorney, Agent, or Firm—Lawrence P. Zale; Marvin Snyder

[57] ABSTRACT

A shear rate imaging method uses magnetic resonance to detect the distribution of velocities within a subject. Distributions are measured responsive to at least two different field-of-views. Differences of the velocity distribution obtained with one field-of-view and the second field-of-view are computed to give a component of shear rate. The method can be used to obtain velocity measurements in any of three mutually orthogonal directions responsive to field-of-view shifts in as many as three mutually orthogonal directions to give a total of nine shear rate components. Data for each component can be acquired independently or data acquisition can be multiplexed to reduce data acquisition requirements.

4 Claims, 6 Drawing Sheets

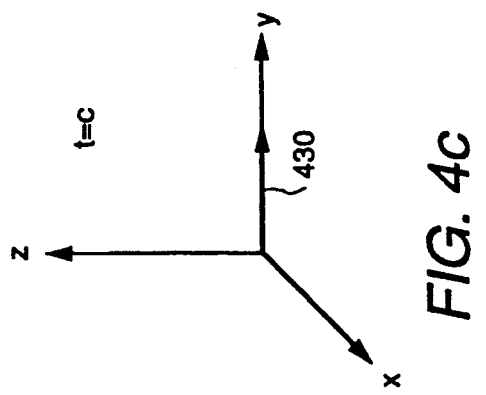
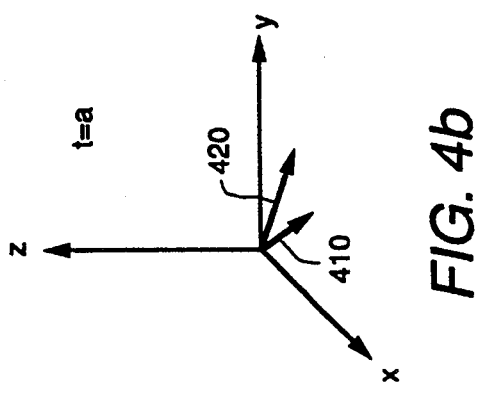
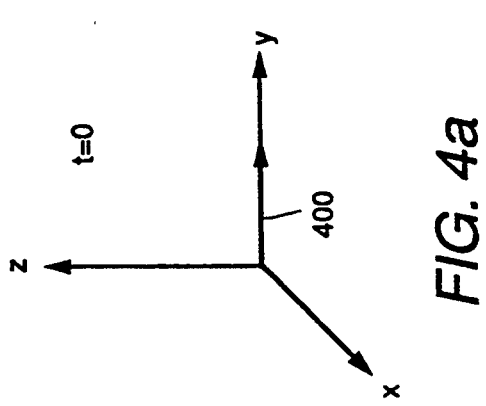
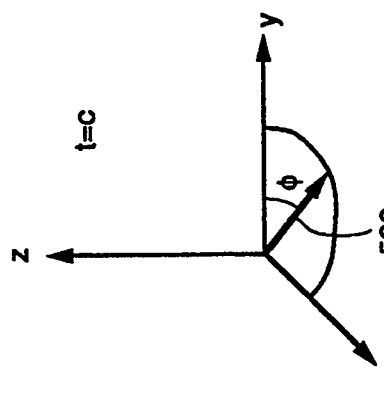
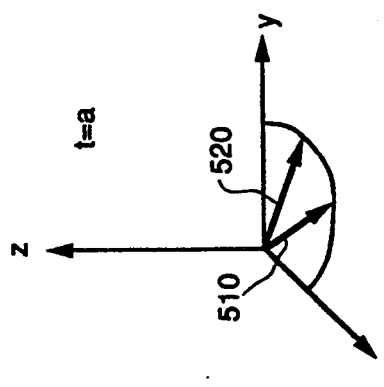
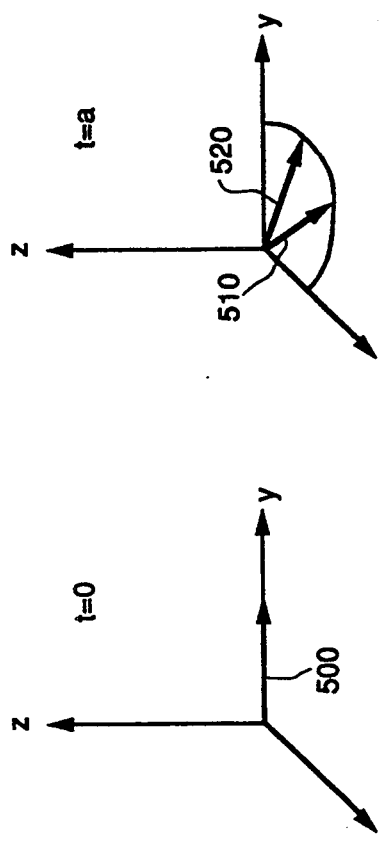

METHODS FOR THE IMAGING OF SHEAR RATE IN MOVING FLUIDS

BACKGROUND OF THE INVENTION

1. Field of the Invention

This invention relates to magnetic resonance (MR) measurement of shear rates of moving materials and more specifically to MR mapping of the velocity of a moving material.

2. Description of Related Art

Shear rate is defined as the change in velocity of a material with respect to position. It is an important parameter in indicating regions of great or little velocity. In flowing materials, such as liquids flowing through metal tubes, shear rate influences the rate of corrosion. By localizing regions of extremely high or low shear rates, portions of a tube wall which may possibly fail could be identified.

Shear rate is also related to the of development of arteriosclerotic disease in mammals. Locations which have low shear rates, are more apt to develop plaque and blockage characteristic of this disease.

A traditional fluid flow analysis method, known as ink streamlining, requires introducing a contrast agent into a flowing fluid and observing the motion of the contrast agent.

Another method of measuring shear rate employs laser Doppler methods. This requires a laser beam to be reflected from particles suspended in the material which is to be measured, and determining the displacement of each particle over a short interval thereby indicating the velocity of the material at the chosen location.

Both of these methods are invasive, or destructive and require direct access to the material being tested. If the material is inside a tube or deep within a living subject, these methods will not be useful. Furthermore, they are not suited for in-vivo, or non-destructive testing applications.

Since velocity is a vector quantity, it can be expressed as the sum of three mutually orthogonal component vectors. Each of these components, in turn, can be measured with respect to three mutually-orthogonal spatial dimensions to give a total of nine different shear rate measurements. Existing techniques can be used to measure some of these shear components, but detection of all components is difficult or impossible in most situations.

SUMMARY OF THE INVENTION

Methods using Magnetic Resonance (MR) pulse sequences for the acquisition of shear rate images are disclosed. These pulse sequences are comprised of a slice-selective rf pulse, conventional phase-encoding and readout gradient pulses for spatial encoding and a bipolar velocity-encoding gradient pulse to encode velocity as a phase shift in the resulting image. The direction of the velocity-encoding gradient determines the component of the velocity which is detected. If desired the procedure can be repeated to obtain images sensitive to orthogonal components of velocity.

Imaging of a selected component of shear rate is performed by repeating the pulse sequence a minimum of four times for each increment of the phase-encoding gradient. In the first acquisition a positive polarity velocity-encoding gradient is applied. In the second acquisition a negative polarity velocity-encoding gradient is applied. During both the first and second acquisition the receiver and transmitter are operated at the same frequency. The third and fourth acquisitions are performed in an identical fashion to the first and second acquisitions, except that the center of the field-of-view is shifted by an amount, D, with respect to the first and second acquisitions.

Data from the first and second acquisitions are used to compute a phase difference data set. The phase of each pixel in the phase difference data set is directly proportional to velocity (assuming no phase wrap). Data from the third and fourth acquisitions are processed in the same way to give a second phase difference data set. Since the third and fourth acquisitions were obtained with an offset field-of-view, however, the second phase difference data set is not exactly registered with the first phase difference data set. Since the first and second phase difference data sets contain velocity information from slightly different points in space a shear rate image can then be computed by taking the phase difference of the first and second phase difference images.

Shear rate images with respect to the three orthogonal spatial dimensions can be made by shifting the third and fourth phase images in the readout, phase-encoding and slice selective directions. Multiplexed detection of velocity components can be used to minimize the amount of data which must be collected.

OBJECTS OF THE INVENTION

It is an object of the present invention to provide a method for the detection and display of a selected component of shear rate within a subject.

It is another object of the present invention to provide a method for the detection and display of all components of shear rate within a subject.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawing in which:

FIGS. 4a–4c are vector illustrations of the effect of bipolar magnetic field gradient pulses on stationary spin magnetization.

FIGS. 5a–5c are vector illustrations of the effect of bipolar magnetic field gradient pulses on moving spin magnetization.

DETAILED DESCRIPTION OF THE INVENTION

In the present embodiment of the invention, a subject is placed within the magnet of a magnetic resonance imaging system. The region over which a shear rate image is desired is then identified by an operator, perhaps with the assistance of a conventional MR imaging sequence. A pulse sequence is then applied and the data analyzed.

Figure 1:
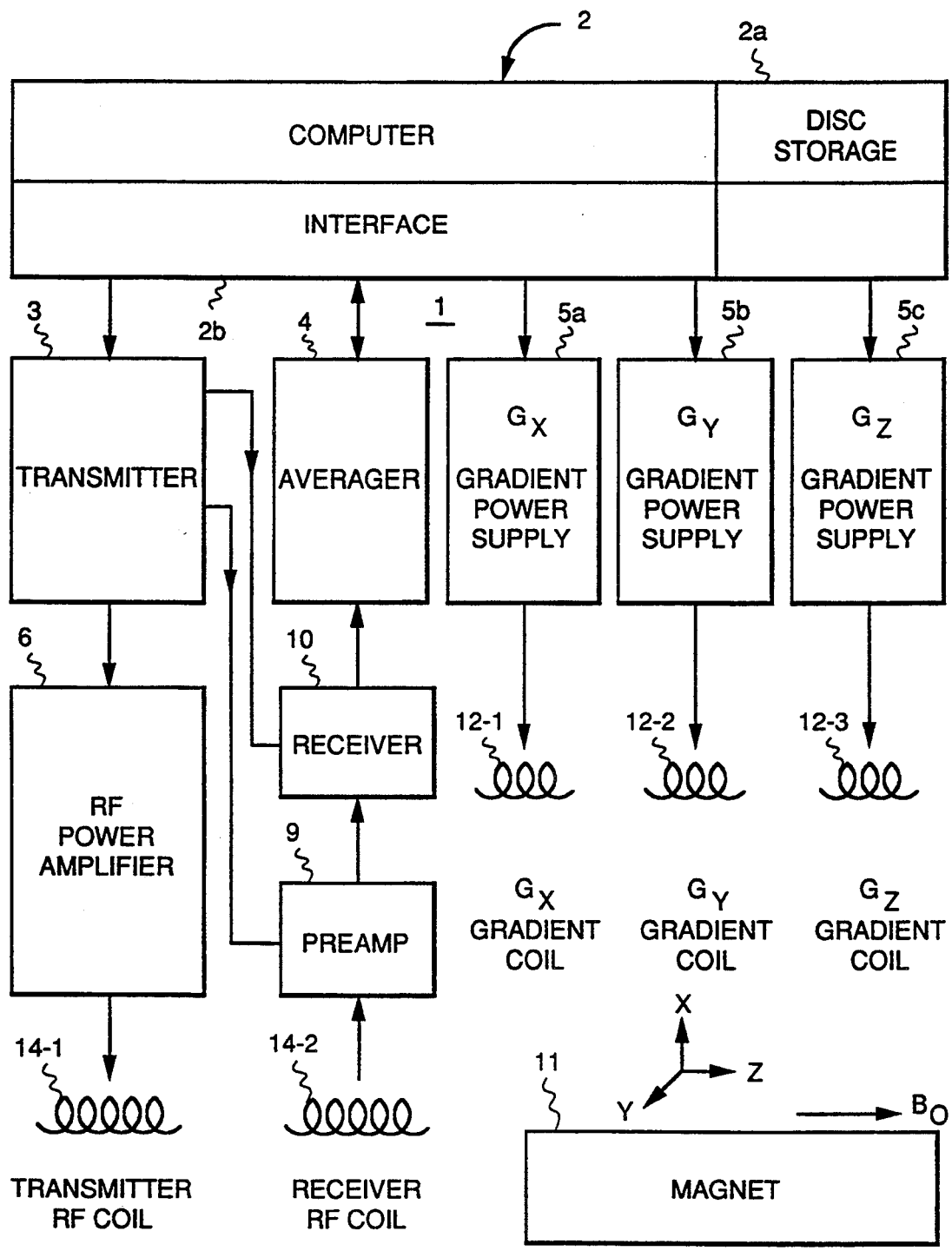
FIG. 1 is a simplified block diagram of a magnetic resonance (MR) imaging system suitable for use with the present invention.

FIG. 1 is a simplified block diagram of the major components of a magnetic resonance (MR) imaging system suitable for use with the invention described herein. The system is comprised of a general purpose mini-computer 2 which is functionally coupled to a disk storage unit 2a and an interface unit 2b. A radiofrequency (RF) transmitter 3, signal averager 4, and gradient power supplies 5a, 5b and 5c, are all coupled to computer 2 through interface unit 2b. Gradient power supplies 5a, 5b and 5c energize gradient coils 12-1, 12-2 and 12-3 to create magnetic field gradients Gx, Gy and Gz, respectively, in the "X", "Y" and "Z" directions respectively, over a subject to be imaged. RF transmitter 3 is gated with pulse envelopes from computer 2 to generate RF pulses having the required modulation to excite an MR response signal from a subject. The RF pulses are amplified in an RF power amplifier 6 to levels varying from 100 watts to several kilowatts, depending on the imaging method, and applied to a transmitter coil 14-1. The higher power levels are necessary for large sample volumes, such as in whole body imaging, and where short duration pulses are required to excite larger NMR frequency bandwidths.

The MR response signal is sensed by a receiver coil 14-2, amplified in a low noise preamplifier 9 and passed to receiver 10 for further amplification, detection, and filtering. The signal is then digitized for averaging by signal averager 4 and for processing by computer 2. Preamplifier 9 and receiver 10 are protected from the RF pulses during transmission by active gating or by passive filtering.

Computer 2 provides gating and envelope modulation for the MR pulses, blanking for the preamplifier and RF power amplifier, and voltage waveforms for the gradient power supplies. The computer also performs data processing such as Fourier transformation, image reconstruction, data filtering, imaging display, and storage functions (all of which are conventional and outside the scope of the present invention).

Transmitter coil 14-1 and receiver RF coil 14-2, if desired, may comprise a single coil. Alternatively, two separate coils that are electrically orthogonal may be used. The latter configuration has the advantage of reduced RF pulse breakthrough into the receiver during pulse transmission. In both cases, the coils are orthogonal to the direction of a static magnetic field B0 produced by a magnet means 11. The coils may be isolated from the remainder of the system by enclosure in an RF shielded cage.

Magnetic field gradient coils 12-1, 12-2 and 12-3 are necessary to provide gradients Gx, Gy and Gz, respectively, that are monotonic and linear over the sample volume. Multi-valued gradient fields cause a degradation in the MR response signal data, known as aliasing, which leads to severe image artifacts. Nonlinear gradients cause geometric distortions of the image.

Figure 2:
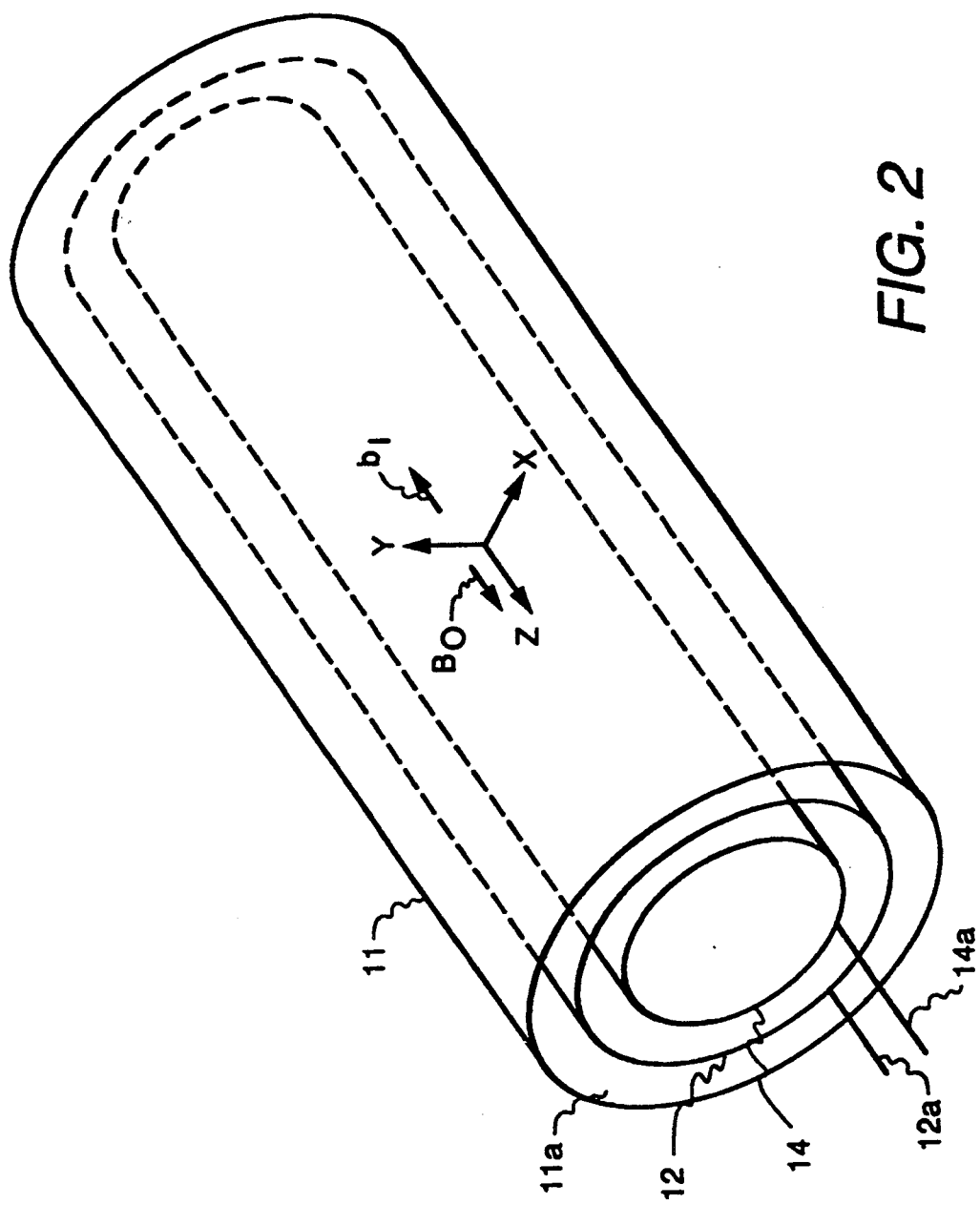
FIG. 2 is a more detailed diagram of the magnet assembly of FIG. 1.

Magnet assembly 11, shown schematically in FIG. 2, has a central cylindrical bore 11a which generates a static magnetic field B0, typically in the axial, or Z Cartesian coordinate direction. A set of coils 12, such as coils 12-1, 12-2 and 12-3 of FIG. 1, receive electrical signals via input connections 12a, and provide at least one gradient magnetic field within the volume of bore 11a. Also situated within bore 11a is an RF coil 14, which receives RF energy via at least one input cable 14a, to provide an RF magnetic field B1, typically in the X-Y plane.

Figure 3A:
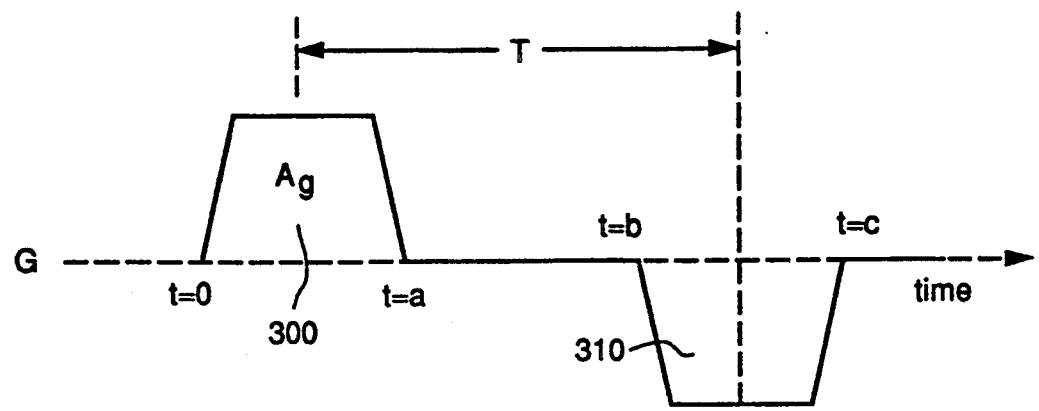
FIG. 3a is a graphical illustration of one embodiment of a velocity-encoding magnetic field gradient pulse sequence which is incorporated into a shear rate imaging pulse sequence.
Figure 3B:
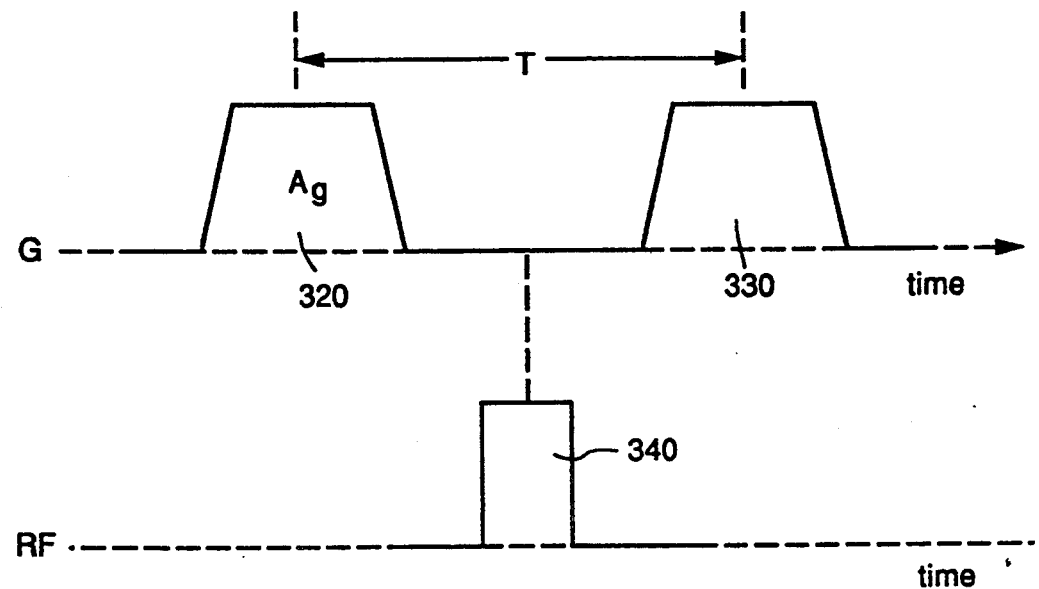
FIG. 3b is a graphical illustration of a second embodiment of a velocity-encoding magnetic field gradient pulse sequence.

FIGS. 3a and 3b show two embodiments of velocity-encoding magnetic field gradient pulse sequences. In FIG. 3a the magnetic field gradient has substantially zero intensity until time t=0. Beginning at t=0 and ending at t=a, a first magnetic field gradient pulse 300 is applied. Beginning at t=b and ending at t=c a second magnetic field gradient pulse 310 having substantially the same duration and intensity of the first gradient pulse, but having opposite polarity, is applied. The time interval between the two gradient pulses is T.

An alternative embodiment of this velocity-encoding gradient pulse is shown in FIG. 3b. This embodiment is similar to the embodiment shown in FIG. 3a with the exception of the addition of a refocusing RF pulse 340 placed between the gradient waveforms 320, 330 and the second waveform 330 having a polarity identical to that of the first gradient pulse 320.

The application of magnetic field gradient pulse sequences such as those of FIGS. 3a and 3b results in a phase shift in transverse spin magnetization which is directly proportional to velocity, the area of each lobe of the pulse sequence being Ag, the gyromagnetic ratio of the nuclear species being γ and the time interval between successive gradient lobes being T. This relationship is well known to those skilled in the art and can be expressed as:

$$\Phi = \gamma V T A g \quad (1)$$

where Φ is the velocity-induced phase shift and V is the velocity component of the nuclear spin parallel to the applied magnetic field gradient.

The effect of a velocity-encoding magnetic field gradient pulse on a body of stationary spin magnetization is shown in FIGS. 4a-4c. For the purpose of illustration, only vectors corresponding to the transverse magnetization of two spins at different positions in the direction of the applied velocity-encoding gradient are shown. After the generation of transverse spin magnetization by an RF pulse, all the spins have the same phase and can be represented as a single vector 400 at time t=0, as shown in FIG. 4a. At time t=a, however, each spin has acquired a phase shift which is directly proportional to its position along the magnetic field gradient, as shown in FIG. 4b. These individual vectors 410, 420 arise from spins which do not change position and thus, when second gradient pulse, 310 of FIG. 3a, is applied the phase shifts generated by first gradient pulse, 300 of FIG. 3a, are exactly cancelled by the second gradient pulse, 310 of FIG. 3a. Consequently, the phase shifts at time t=c for each spin is identical, and the two vectors coincide and are represented as a single vector 430 in FIG. 4c. The phase shift at time t=c is substantially identical to the phase shift found at time t=0.

The effect of a velocity-encoding magnetic field gradient pulse on a body of moving spin magnetization shown in FIGS. 5a-5c differs from that on a body of stationary spin magnetization shown in FIGS. 4a-4c. For the purpose of illustration, only vectors corresponding to the transverse spin magnetization of two spins traveling at the same velocity, but at different positions in the direction of the applied velocity-encoding gradient, are shown. After the generation of transverse spin magnetization by an RF pulse, all the spins have the same phase and can be represented as a single vector 500 at time t=0, as shown in FIG. 5a. At time t=a, however, each spin has acquired a phase shift which is directly proportional to its position along the magnetic field gradient as shown by vectors 510, 520 in FIG. 5b. These individual vectors arise from spins which change position with time and thus, when the second gradient pulse is applied, the phase shifts generated by the first pulse are not entirely cancelled by the second gradient pulse. Consequently, the phase shift at time t=c, represented by the single vector 530 as shown in FIG. 5c, differs from the phase shift found at time t=0 by an amount $\Phi$. This phase shift is directly proportional to velocity V of equation 1.

Figure 6:
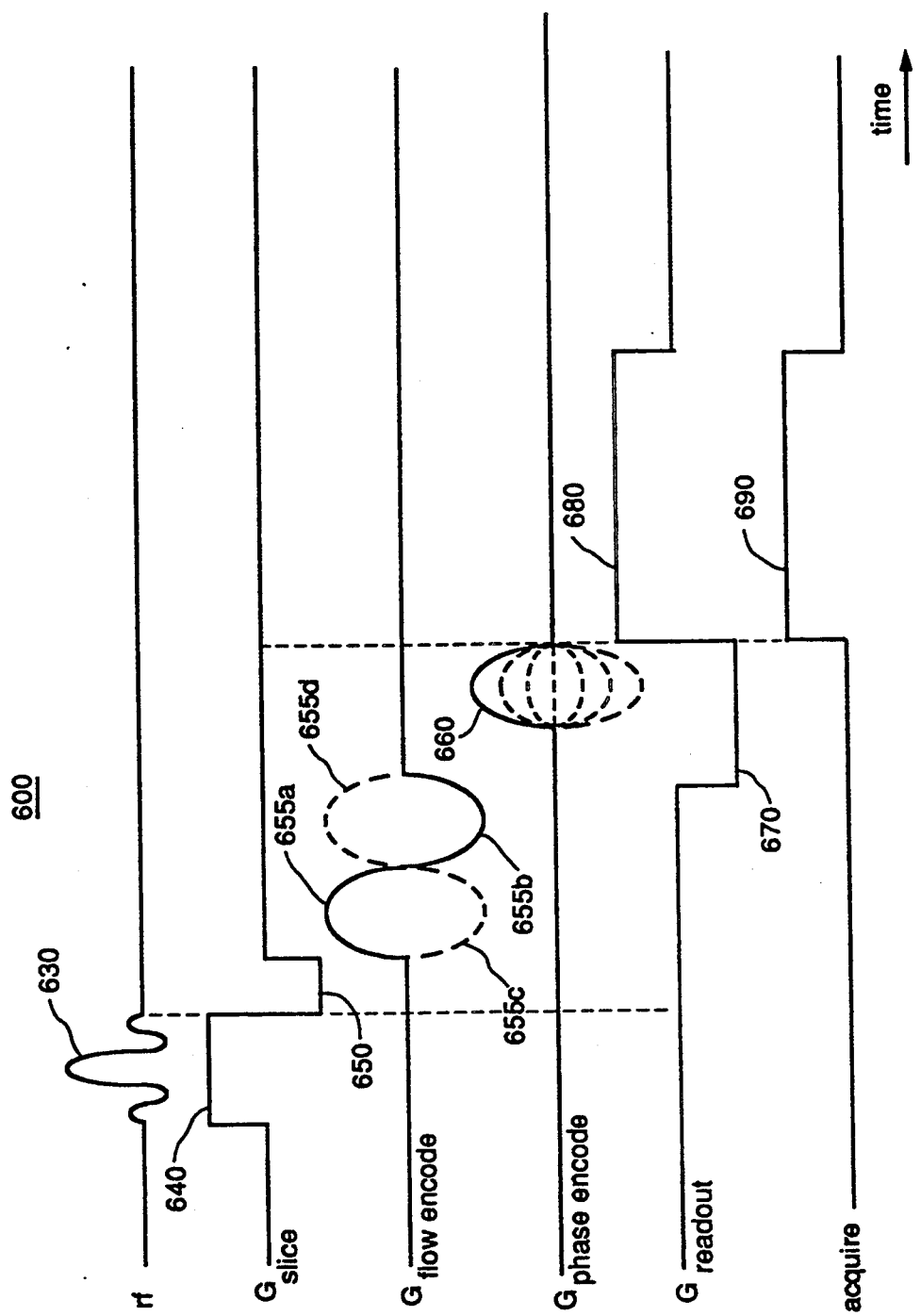
FIG. 6 is pulse sequence diagram of a first embodiment of the present invention which can be used to measure the distribution of shear rate within a subject.

FIG. 6 is a pulse sequence diagram of radio frequency (RF) pulses and magnetic field gradients employed in a first embodiment of the present invention which may be executed by the MR imaging system of FIGS. 1 and 2. Pulse sequence 600 is comprised of a excitation RF pulse 630 which is applied in the presence of a slice selective magnetic field gradient pulse 640. Excitation pulse 630 nutates spin magnetization in a selected portion of the subject. The amount of nutation can be selected by selecting the duration and amplitude of detection pulse 630. The location and size of the selected portion can be adjusted by appropriate selection of the frequency and bandwidth of RF pulse 630 and the amplitude of slice selective magnetic field gradient pulse 640.

After the excitation RF pulse 630 and slice selective magnetic field gradient pulse 640 are applied, a slice refocusing magnetic field gradient pulse 650 is applied. Slice refocusing gradient pulse 650 has an amplitude and duration which is selected to cause all transverse spin magnetization within the selected portion of the subject to be substantially in phase after the application of slice refocusing gradient pulse 640. In the present embodiment the product of the amplitude and duration of slice refocusing gradient pulse 650 is substantially half that of the negative of the product of the amplitude and duration of slice selective gradient pulse 640 in a manner well known to those skilled in the art.

After excitation RF pulse 630 and slice selection gradient pulse 640 have been applied, a bipolar velocity-encoding magnetic field gradient pulse is applied in a selected direction. The velocity-encoding pulse consists of a first velocity-encoding magnetic field gradient pulse lobe 655a and a second velocity-encoding magnetic field gradient pulse lobe 655b. The product of the pulse duration and amplitude of second velocity-encoding pulse lobe 655b is substantially equal to the negative of the product of the pulse duration and amplitude of the first velocity-encoding pulse lobe 655a as described in FIG. 3.

Successive application of first velocity-encoding pulse lobe 655a and second velocity-encoding pulse lobe 655b to transverse spin magnetization causes a phase shift in the magnetization which is proportional to the velocity component of the magnetization parallel to the direction of the velocity-encoding magnetic field gradient. This phase shift can be used to distinguish moving from stationary transverse spin magnetization.

After excitation RF pulse 630 and slice selection gradient pulse 640 have been applied, a phase encoding magnetic field gradient pulse 660 of a selected amplitude is applied. Phase encoding gradient pulse 660 is applied in a direction substantially orthogonal to slice selective gradient pulse 640 and can be applied simultaneously with slice refocusing pulse 650 if desired. For the sake of clarity, phase encoding pulse 660, velocity-encoding pulses 655a, 655b and slice refocusing pulse 650 are not shown to be simultaneous in FIG. 6, but it is possible to apply combinations of these pulses simultaneously.

After excitation RF pulse 630 and slice selective gradient pulse 640 have been applied, a readout dephasing magnetic field gradient pulse 670 of a selected amplitude is applied. Readout dephasing gradient pulse 670 is applied in a direction substantially orthogonal to both slice selective gradient pulse 640 and phase encoding pulse 660. Readout dephasing pulse 670 can be applied simultaneously with either slice refocusing pulse 650 or phase encoding pulse 660 if desired. Readout dephasing pulse 670 causes transverse magnetization at different positions along the direction of the readout dephasing magnetic field gradient to obtain phase shifts which are proportional to position in the readout direction.

Following the application of slice refocusing pulse 650, phase encoding pulse 660 and readout dephasing pulse 670, a readout magnetic field gradient pulse 680 is applied. Readout pulse 680 is applied in the same direction as readout dephasing pulse 670, but is given the opposite polarity. The amplitude and duration of readout pulse 680 is selected so that substantially all transverse spin magnetization has an identical phase shift at a selected point during readout pulse 680.

Substantially simultaneously with the application of readout pulse 680, a data acquire signal pulse 690 is sent to a data acquisition subsystem which is part of the imaging system. MR response signals are digitized during data acquire pulse 690. Since the MR response signals coming from resonant nuclei within the selected portion of the subject are acquired during readout magnetic field gradient 680, each detected MR response signal will have a frequency which is proportional to the location of the resonant nuclei which generated said signal. The location of each signal source can be determined by applying a Fourier transformation to the acquired signal data in a fashion well known to those skilled in the art.

In the present invention pulse sequence 600 is repeated a plurality, N, times to form a single frame of data which has sufficient information to permit the measurement of at least one component of shear rate. The acquisition of a frame is repeated a plurality, Y, times. In each frame acquisition, phase encoding pulse 660 is given a different amplitude. Phase encoding pulse 660 causes phase shifts in the detected MR signals which are proportional to the position of resonant nuclei giving rise to transverse spin magnetization along the direction of phase encoding magnetic field gradient 660. Data acquired responsive to different amplitudes of phase encoding gradient 660 can be Fourier transformed to give the position (in the direction of phase encoding gradient 660) of the resonant nuclei producing transverse spin magnetization in a manner well known to those skilled in the art.

In a first embodiment of the present invention, each frame consists of N=4 applications of pulse sequence 600. In the first application, velocity-encoding gradient pulses 655a, 655b are applied with a selected polarity. This causes the phase of the transverse spin magnetization to be proportional to velocity. The phase of each portion of transverse spin magnetization, however, will also have contributions from sources other than velocity. These sources may include transmitter offsets, chemical shift effects and eddy currents.

In order to remove contributions from all components other than velocity, pulse sequence 600 is applied a second time and a second set of MR response signals is acquired. The RF and magnetic field gradient pulses of the second application are identical to that of the first with the exception of first velocity-encoding pulse lobe 655a and second velocity-encoding pulse lobe 655b. In their place a third velocity-encoding pulse lobe 655c followed by a fourth velocity-encoding pulse lobe 655d are applied. Third and fourth velocity-encoding pulse lobed 655c, 655d are identical to first and second velocity-encoding pulse lobes 655a, 655b respectively, except that they have opposite polarity. The MR response signal set collected from the first application is then subtracted from MR response signal set collected in the second application to result in a first difference set. Phase shifts induced by the third and fourth velocity-encoding gradient lobes have opposite polarity relative to the phase shifts induced by the first and second velocity-encoding gradient lobes.

When the phase of the MR response signal set acquired from the first application of pulse sequence 600 is subtracted from the phase of the MR response signal set acquired responsive to the second application of pulse sequence 600, phase contributions from all non-velocity sources are substantially canceled, leaving only a phase shift arising from velocity. This phase shift is directly proportional to velocity and can be used to quantify velocity.

Figure 7:
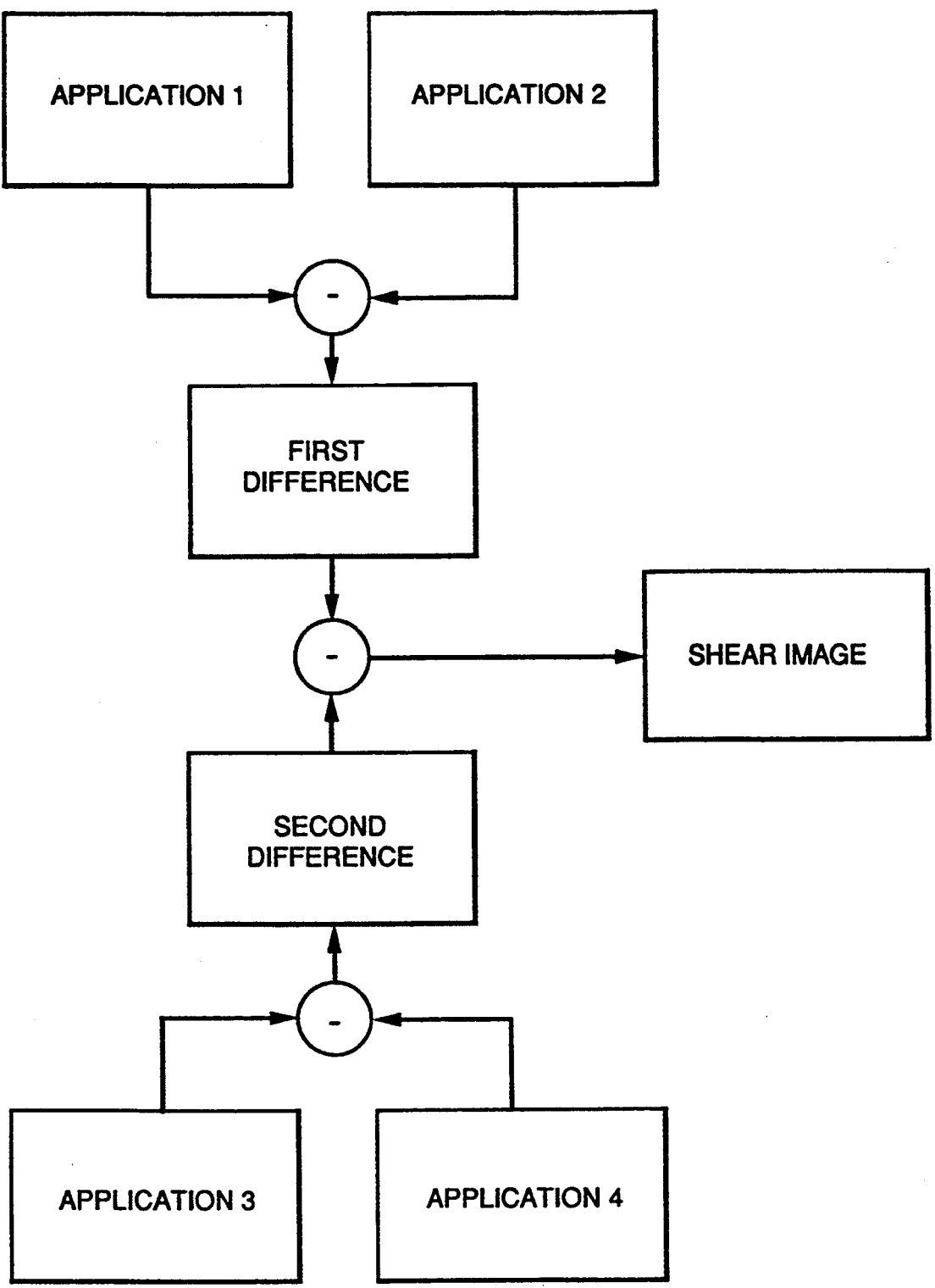
FIG. 7 is schematic diagram illustrating the data processing steps required to obtain shear rate images using the pulse sequence shown in FIG. 6.

A third and fourth application of pulse sequence 600 are then performed in a manner identical to that of the first and second application, respectively, with the exception that the center of the field-of-view is shifted in a selected direction by a selected amount, D, which is described later. A second difference set is generated from a third and fourth application of pulse sequence 600. Shear rate information, which is defined as the changes in velocity with respect to the direction of the field-of-view shift, can be calculated by computing the differences of the phases of the first and second difference sets as illustrated in FIG. 7. It should be noted that the shift in the center of the field-of-view can be less than the size of a single pixel in the final image.

The direction selected for shifting the center of the field-of-view determines how pulse sequence 600 will be modified in the third and fourth applications. If the selected direction is parallel to the direction of the slice selection gradient pulse 640, the field-of-view shift is performed by changing the frequency of both the transmitter 3 and receiver 10 of the MR imaging system of FIG. 1 by an amount F which is determined by the gyromagnetic ratio of the nuclear spins and the strength of slice refocusing gradient pulse 650. If the selected direction is parallel to the direction of the readout gradient pulse 680, the field-of-view shift is performed by changing the frequency of either the receiver 10 or the transmitter 3 by an amount F' which is determined by the gyromagnetic ratio of the nuclear spins desired to be imaged, the data acquisition rate and the strength of the readout gradient pulse 680. If the selected direction is parallel to the direction of the phase encoding gradient pulse 660, a phase shift is added to the phase of the transmitter. This phase shift is incremented by an amount P for each of the Y increments of phase encoding gradient pulse 660. The incremental phase shift P is determined by the gyromagnetic ratio of the nuclear spins, the field-of-view and Y and is directly proportional to the product of the amplitude and duration of phase encoding gradient pulse 660.

The modifications to pulse sequence 600 which are required to perform changes in the center of the field-of-view are summarized in Table 1. Note that shifting the field-of-view center can only be performed in a single desired direction for each frame. Consequently, if all components of shear rate are to be measured, frames for each of three velocity directions must be measured with respect to each of three orthogonal spatial dimensions, for a total of nine measurements. Since each frame in the present embodiment requires four repetitions of pulse sequence 600, a total of 9×4=36 repetitions of pulse sequence 600 are required to measure all components of shear rate.

TABLE 1

| Application | Flow Encoding | Slice Select Shift | Readout Shift | Phase Encoding Shift |
|---|---|---|---|---|
| 1 | 655a, 655b | 0 | 0 | 0 |
| 2 | 655c, 655d | 0 | 0 | 0 |
| 3 | 655a, 655b | F | F' | P |
| 4 | 655c, 655d | F | F' | P |

In a second embodiment of the current invention, the detection of orthogonal components of velocity are multiplexed to more efficiently acquire all components of shear rate. Using a Hadamard multiplexing scheme it is possible to obtain quantitative information for all three velocity vector components at a selected field-of-view offset with only four applications of pulse sequence 600. All shear rate components can then be determined by collecting additional MR response signals responsive to field-of-view shifts in the slice select, readout and phase encoding directions. Such a scheme requires only 4×4=16 applications of pulse sequence 600. One embodiment of such a scheme is given in table 2. Here "+" denotes the application of first and second velocity-encoding pulses 655a, 655b and "−" denotes the application of third and fourth velocity-encoding pulses 655c, 655d. In this embodiment applications 1–4 are used to obtain the three-mutually orthogonal velocity vectors for the unshifted field-of-view, applications 5–8 are used to obtain the three-mutually orthogonal velocity vectors for the MR response signal set shifted in the slice select direction, applications 9–12 are used to obtain the three-mutually orthogonal velocity vectors for the MR response signal set shifted in the readout direction, and applications 13–16 are used to obtain the three-mutually orthogonal velocity vectors for the MR response signal set shifted in the phase encoding direction. After Hadamard demultiplexing of individual components of velocity, shear rate images with respect to the slice select direction can be obtained by subtracting the MR response signal set acquired in applications 1–4 from the MR response signal set acquired in applications 5–8. Likewise, shear rate images with respect to the readout direction can be obtained by subtracting the MR response signal set acquired in applications 1–4 from the MR response signal set acquired in applications 9–12 and shear rate images with respect to the phase encoding direction can be obtained by subtracting the MR response signal set acquired in applications 1–4 from the MR response signal set acquired in applications 13–16.

TABLE 2

| Application | Flow Encoding | | | Slice Select Shift | Readout Shift | Phase-encoding Shift |
|---|---|---|---|---|---|---|
| | SS | RO | PE | | | |
| 1 | + | + | + | 0 | 0 | 0 |
| 2 | − | − | + | 0 | 0 | 0 |
| 3 | − | + | − | 0 | 0 | 0 |
| 4 | + | − | − | 0 | 0 | 0 |
| 5 | + | + | + | F | 0 | 0 |
| 6 | − | − | + | F | 0 | 0 |
| 7 | − | + | − | F | 0 | 0 |
| 8 | + | − | − | F | 0 | 0 |
| 9 | + | + | + | 0 | F' | 0 |
| 10 | − | − | + | 0 | F' | 0 |
| 11 | − | + | − | 0 | F' | 0 |
| 12 | + | − | − | 0 | F' | 0 |
| 13 | + | + | + | 0 | 0 | P |
| 14 | − | − | + | 0 | 0 | P |
| 15 | − | + | − | 0 | 0 | P |
| 16 | + | − | − | 0 | 0 | P |

While several presently preferred embodiments of the novel MR shear rate imaging method have been described in detail herein, many modifications and variations will now become apparent to those skilled in the art. It is, therefore, to be understood that the appended claims are intended to cover all such modifications and variations as fall within the true spirit of the invention.

What is claimed is:

1. A method for the generation of shear rate images of a subject with magnetic resonance, comprising the steps of:

a) placing said subject into a magnetic field to polarize nuclear spins;

b) applying a radiofrequency (RF) pulse having a selected frequency and phase to said subject to nutate a selected ensemble of nuclear spins in a selected slice of said subject oriented perpendicular to a first direction to create transverse spin magnetization;

c) applying a phase encoding magnetic field gradient pulse of a selected amplitude in a second direction being substantially orthogonal to the first direction;

d) applying a velocity-encoding magnetic field gradient pulse of a selected polarity to the subject to cause the transverse spin magnetization to acquire a velocity-induced phase shift;

e) applying a readout magnetic field gradient pulse in a third selected direction substantially orthogonal to the first and second directions;

f) detecting with a receiver operating at a selected frequency the transverse spin magnetization in the presence of the readout magnetic field gradient pulse;

g) repeating steps 'b'-'f' with a velocity-encoding gradient pulse polarity substantially opposite that of the prior repetition;

h) computing an MR response signal difference data set responsive to changes in the velocity-encoding magnetic field gradient pulse;

i) repeating steps 'b'-'h' with a selected field-of-view offset in one of the first, second and third directions;

j) computing a difference set responsive to changes in the field-of-view;

k) repeating steps 'b'-'j' a plurality, Y times, each repetition having a unique amplitude for the phase encoding gradient pulse; and l) reconstructing a shear rate image by performing a two-dimensional Fourier transform of the computed difference sets.

2. The method of claim 1 where the field-of-view offset in the first direction is accomplished by changing the frequency of the RF pulse and receiver by an amount F.

3. The method of claim 1 where the field-of-view offset in the second direction is accomplished by selecting the phase of the RF pulse to be proportional to the amplitude of the phase encoding gradient for each of the Y repetitions.

4. The method of claim 1 where the field-of-view offset in the third direction is accomplished by changing the frequency of the receiver with respect to the RF pulse by an amount F'.

* * * * *